United States Patent [19]

van de Plassche et al.

[11] Patent Number: 4,870,417

[45] Date of Patent: Sep. 26, 1989

[54] ERROR CORRECTION CIRCUIT SUITABLE FOR THERMOMETER OR CIRCULAR CODE

[75] Inventors: Rudy J. van de Plassche, Waalre, Netherlands; Peter G. Baltus, Sunnyvale, Calif.

[73] Assignee: North American Philips Corporation, Signetics Division, Sunnyvale, Calif.

[21] Appl. No.: 155,402

[22] Filed: Feb. 12, 1988

[51] Int. Cl.[4] .......................................... H03M 13/00
[52] U.S. Cl. ...................................... 341/118; 341/94
[58] Field of Search ........................ 307/354, 355, 356; 341/94, 118, 155, 158; 364/734; 371/30, 35, 55, 57, 65

[56] References Cited

U.S. PATENT DOCUMENTS 4,712,087  12/1987  Traa .................................... 341/118

FOREIGN PATENT DOCUMENTS 208437  6/1986  European Pat. Off. .

OTHER PUBLICATIONS

R. van de Grift et al.; "A Monolithic 8-Bit Video A/D Converter"; IEEE JSSC; Jun. 1984; pp. 374–378.

Primary Examiner—William M. Shoop, Jr.
Assistant Examiner—Marc S. Hoff
Attorney, Agent, or Firm—R. Meetin; D. Treacy; T. Briody

[57] ABSTRACT

An error correction circuit employs a digital averaging technique to overcome transition bit errors in a plurality of original binary bits ideally arranged as a thermometer or circular code. The circuit first generates a like plurality of intermediate signals respectively corresponding to the original bits. Each intermediate signal varies according to a weighted analog summation of a specified odd number of consecutive original bits centered about the corresponding bit. The circuit then compares the intermediate signals with corresponding further signals to produce a corrected code.

20 Claims, 8 Drawing Sheets

ERROR CORRECTION CIRCUIT SUITABLE FOR THERMOMETER OR CIRCULAR CODE

FIELD OF USE

This invention relates generally to electronic circiutry and, more particularly, to circuits that correct errors in digital codes.

BACKGROUND ART

An analog-to-digital converter (ADC) of the flash type contains a set of input comparators that ideally produce a "thermometer" code—i.e., a digital code consisting of a group of binary "1s" followed by a group of binary "0s" or vice versa—as an intermediate step in converting an analog input voltage into a digital output signal. The thermomoter code has no "0s" in the group of "1s" and vice versa. For example, see the flash ADC described in Peterson, "A monolithic Video A/D Converter," *IEEE JSSC*, Dec. 1979, pp. 932–937.

Table I below illustrates the structure of an M-bit thermometer code in more detail. M is 3 or more. The code consists of M digital signals represented here as bits $D_1$, $D_2$ ... $D_M$. Including the "all 0" and "all 1" cases, there are M+1 permutations of "1s" and "0s".

The permutations can be defined in algorithmic form as a function of an integer variable P. An arbitrary one of bits $D_1$–$D_M$ is referred to as bit $D_i$, where "i" is a running integer.

TABLE I

| | Thermometer Code) | | | | | | |
|---|---|---|---|---|---|---|---|
| P | $D_1$ | $D_2$ | $D_3$ | $D_4$ | ... | $D_{M-1}$ | $D_M$ |
| <0 | 0 | 0 | 0 | 0 | | 0 | 0 |
| 0 | 0 | 0 | 0 | 0 | | 0 | 0 |
| 1 | 1 | 0 | 0 | 0 | | 0 | 0 |
| 2 | 1 | 1 | 0 | 0 | | 0 | 0 |
| 3 | 1 | 1 | 1 | 0 | | 0 | 0 |
| 4 | 1 | 1 | 1 | 1 | | 0 | 0 |
| . | | | | | | | |
| M−1 | 1 | 1 | 1 | 1 | | 1 | 0 |
| M | 1 | 1 | 1 | 1 | | 1 | 1 |
| >M | 1 | 1 | 1 | 1 | | 1 | 1 |

At any particular value of P in the digital range extending from 0 to M, each bit $D_i$ is a "0" for i>P and a "1" for i≦P. This expresses the concept that the size of the group of "1s" increases by one each time that P increases by 1. P is the digital equivalent of the analog input voltage. The positions of the "1s" and "0s" could be reversed in Table I.

A "circular" code is an extension of a thermometer code to include all the possible permutations of a group of "1s" and a group of "0s". Table II below illustrates the organization of an M-bit circular code. The permutations are defined as a function of variable P in the same manner as the thermometer code. In fact, the portion of Table II for 0≦P≦M is the same as Table I. The remainder of Table II shows how the group of "0s" reappears and then progressively increases in size to enable the circular code to "wrap around" the ends when P reaches 2M.

TABLE II

| | Circular Code | | | | | | |
|---|---|---|---|---|---|---|---|
| P | $D_1$ | $D_2$ | $D_3$ | $D_4$ | ... | $D_{M-1}$ | $D_M$ |
| 0 | 0 | 0 | 0 | 0 | | 0 | 0 |
| 1 | 1 | 0 | 0 | 0 | | 0 | 0 |
| 2 | 1 | 1 | 0 | 0 | | 0 | 0 |
| 3 | 1 | 1 | 1 | 0 | | 0 | 0 |
| 4 | 1 | 1 | 1 | 1 | | 0 | 0 |
| . | | | | | | | |
| M−1 | 1 | 1 | 1 | 1 | | 1 | 0 |
| M | 1 | 1 | 1 | 1 | | 1 | 1 |
| M+1 | 0 | 1 | 1 | 1 | | 1 | 1 |
| M+2 | 0 | 0 | 1 | 1 | | 1 | 1 |
| M+3 | 0 | 0 | 0 | 1 | | 1 | 1 |
| M+4 | 0 | 0 | 0 | 0 | | 1 | 1 |
| . | | | | | | | |
| 2M−1 | 0 | 0 | 0 | 0 | | 0 | 1 |
| 2M | 0 | 0 | 0 | 0 | | 0 | 0 |

Circular codes are used in ADCS of the folding type such as that disclosed in U.S. patent application, Ser. No. 809,453, filed Dec. 16, 1985, continued as Ser. No. 096,793, filed Sept. 14, 1987, now U.S. Pat. No. 4,831,379.

The input stage that generates a thermometer or circular code occasionally causes a "1" to be erroneously mixed in the group of "0s" or vice versa. This sort of error is referred to here as a transition bit error because there is at least one extra transition between "0" and "1". A transition bit error normally occurs near where the code makes its intended transitions between "0" and "1", especially in flash and folding ADCs.

For example, a 6-bit thermometer code ($D_1D_2D_3D_4D_5D_6$) appears as (110000) when P is 2. If $D_4$ is produced as a "1" instead of a "0", the code actually appears as (110100). The presence of three transitions between "0" and "1" indicates a transition bit error.

The error creates two main problems. Firstly, one cannot tell whether $D_4$ should be a "0" or $D_3$ should be a "1" because the bit transistions occur after the other. The actual code does not provide any indication whether the intended code is (110000) or (111100). Secondly, in the absence of a suitable correction mechanism, the output circuitry that transforms the code into the digital output signal in an ADC is usually not designed to handle situations where there is more than one transition between "0" and "1". A bit transition error can seriously foul up the output signal.

One way of attacking these problems is to put the code through a digital logic circuit that either converts the "1" at $D_4$ to a "0" or converts the "0" at $D_3$ to a "1". The resulting code is in a thermometer format. The bit error is 0 or 2 because of the uncertainty about the intended code. The average bit error is 1. However, the mean-square bit error is $\sqrt{2}$ or approximately 1.4. This is unduly high for performance indicators, such as signal-to-noise ratio, based on the mean-square error rather than the average error.

GENERAL DISCLOSURE OF THE INVENTION

The present invention provides an error correction circuit that uses a digital "averaging" technique to overcome transition bit errors in a plurality of original binary bits ideally arranged as a thermometer or circular code. The error correction is basically accomplished in two steps. The correction circuit first generates a like plurality of intermediate signals respectively corresponding to the original bits. Each intermediate signal varies according to a weighted analog summation of a selected odd number of consecutive original bits centerd around the corresponding original bit. The correction circuit of the invention then compares the intermediate signals with corresponding further signals to produce a like plurality of "corrected" bits.

If there is a single transition bit error in the original bits, the present circuit generates the corrected bits in a true thermometer or circular format. For example, consider the above-mentioned 6-bit code which is erroneously supplied as (110100). By virtue of the digital averaging, the correction circuit converts the original (110100) code into a true thermometer code (111000). The circuit also corrects certain types of multiple transition bit errors.

In the foregoing example, the corrected code is one bit away from the originally intended code regardless of whether it is (110000) or (111100). Thus, the average bit error is the same as that produced with the digital scheme mentioned above. However, the mean-square bit error in the invention is only 1. This is 30% less than in the digital scheme. The invention thereby provides a significant advantage in applications, such as ADCs, where there are important performance indicators dependent on the mean-square error.

BRIEF DESCRIPTION OF THE DRAWINGS

Like reference symbols are employed in the drawings and in the description of the preferred embodiments to represent the same or very similar item or items. "N" is used as a subscript to indicate signals complementary to previously defined signals.

DESCRIPTION OF THE PREFERRED EMBODIMENTS

Figure 1:
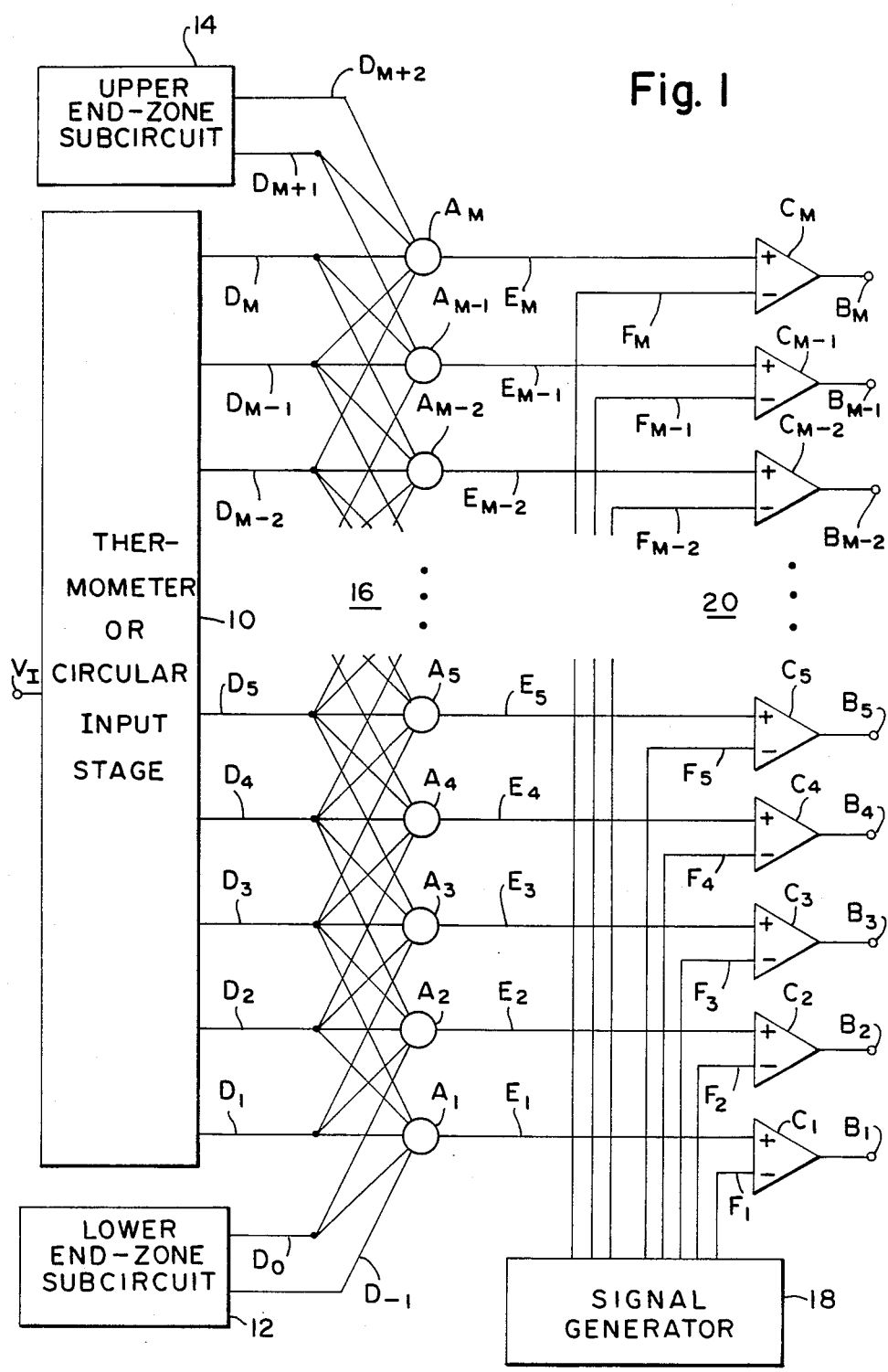
FIG. 1 is a block diagram of a general circuit for correcting transition bit errors in a thermometer or circular code in accordance with the invention.

Referring to the drawings, FIG. 1 illustrates a circuit that applies the digital "averaging" principles of the invention to correct transition bit errors in a code intended to be in thermometer or circular format. The code to be corrected consists of M original bits $D_1-D_M$ supplied from an input stage 10 in response to an analog input voltage $V_I$. Depending on whether a thermometer or circular code is desired, bits $D_1-D_M$ ideally have the characteristics shown in Table I or II and discussed above. A network consisting of lower and upper end-zone subcircuits 12 and 14, summing circuitry 16, a signal generator 18, and comparing circuitry 20 corrects transition bit errors in bits $D_1-D_M$.

Summing circuitry 16 receives bits $D_1 D_M$. In addition, circuitry 16 needs some extra bits to enable error correction to be made near the beginning and end of the original code. Subcircuits 12 and 14 provide the extra bits.

In particular, lower subcircuit 12 supplies K bits $D_{-K+1} \ldots D_0$. Upper subcircuit 14 similarly supplies another K bits $D_{M+1} \ldots D_{M+K}$. K is typically 1 but may be higher depending on the desired correction accuracy. FIG. 1 shows the case in which K is 2. The values of bits $D_{-K+1}-D_0$ and $D_{M+1}-D_{M+K}$ are determined in the manner discussed below.

Summing circuitry 16 consists of M interconnected summing elements $A_1, A_2 \ldots A_M$ that respectively generate M intermediate voltage signals $E_1, E_2 \ldots E_M$ in response to the M+2K bits $D_{-K+1}-D_{M+K}$. Each summing element $A_i$ receives the 2K+1 bits $D_{i-K} \ldots D_i \ldots D_{i+K}$, where "i" is again a running integer. Each element $A_i$ then produces its signal $E_i$ so as to vary substantially according to a weighted analog summation of bits $D_{i-K}-D_{i+K}$. More precisely, $E_i$ is a function of $$\sum_{j=-K}^{K} a_{ij} D_{i+j},$$

where "j" is a running integer, and the $a_{ij}$ terms are the weighting constants.

Each signal $E_i$ normally varies with $$\sum_{j=-K}^{K} a_{ij} D_{i+j}$$

in a largely stepwise linear manner. This relationship can be expressed as:

$$E_i \approx A_{Ei} + B \sum_{j=-K}^{K} a_{ij} D_{i+j} \quad (1)$$

where $A_{Ei}$ is a constant for element $A_i$, and B is a general constant. Elements $A_1-A_M$ are preferably identical. Consequently, the $A_{Ei}$ constants are substantially equal. The $a_{ij}$ weighting constants at each value of i are likewise substantially equal. Eq. (1) can then be simplified to:

$$E_i \approx A + B \sum_{j=-K}^{K} a_j D_{i+j} \quad (2)$$

where A is a general constant for circuitry 16, and the $a_j$ terms are the simplified weighting constants. The $a_j$ constants are typically equal. Eq. (2) then becomes:

$$E_i \approx A + B \sum_{j=-K}^{K} D_{i+J} \quad (3)$$

where each of the $a_j$ terms has been arbitrarily set at 1.

Signal generator 18 supplies M further voltage signals $F_1, F_2 \ldots F_M$ at values that depend on whether a single-ended or double-ended averaging structure is desired. In the single-ended case, each voltage $F_i$ is set at a reference level typically about halfway between the extreme voltage levels achieved by corresponding signal $E_i$ during normal circuit operation. The reference levels are preferably the same. In the double-ended case, each signal $F_i$ is provided as the complement of signal $E_i$ in the manner discussed below.

Comparing circuitry 20 consists of M comparators $C_1, C_2 \ldots C_M$ that respectively produce M "corrected" digital bits $B_1, B_2 \ldots B_M$ by comparing voltages $E_1-E_M$ respectively with voltages $F_1-F_M$. Letting b1 be a selected one of binary vaslues "0" and "1", each comparator $C_i$ supplies its bit $B_i$ as value b1 if $E_i$ is greater than $F_i$. The reverse occurs when $E_i$ is less than $F_i$. Comparator $C_i$ produces bit $B_i$ at a binary value b2 opposite to b1. Whether b1 and b2 respectively equal "1" and "0" or vice versa depends on the internal structure of summing element $A_i$. The normal results it that bit $B_i$ is provided as a "1" if the "average" of bits $D_{i-K}-D_{i+K}$ is high (e.g., greater than ½) and as a "0" if the average is low (e.g., less than ½).

Corrected bits $B_1-B_M$ ideally form a thermometer or circular code. Due to the digital averaging, the number of transition bit errors that occur in bits $B_1-B_M$ during a typical operational period is much less than the number of transition bit errors present in bits $D_1 \ldots D_M$. This is particularly true for single transition bit errors. Setting K equal to 1 so as to achieve an averaging over 3 bits provides very good accuracy.

Figure 2:
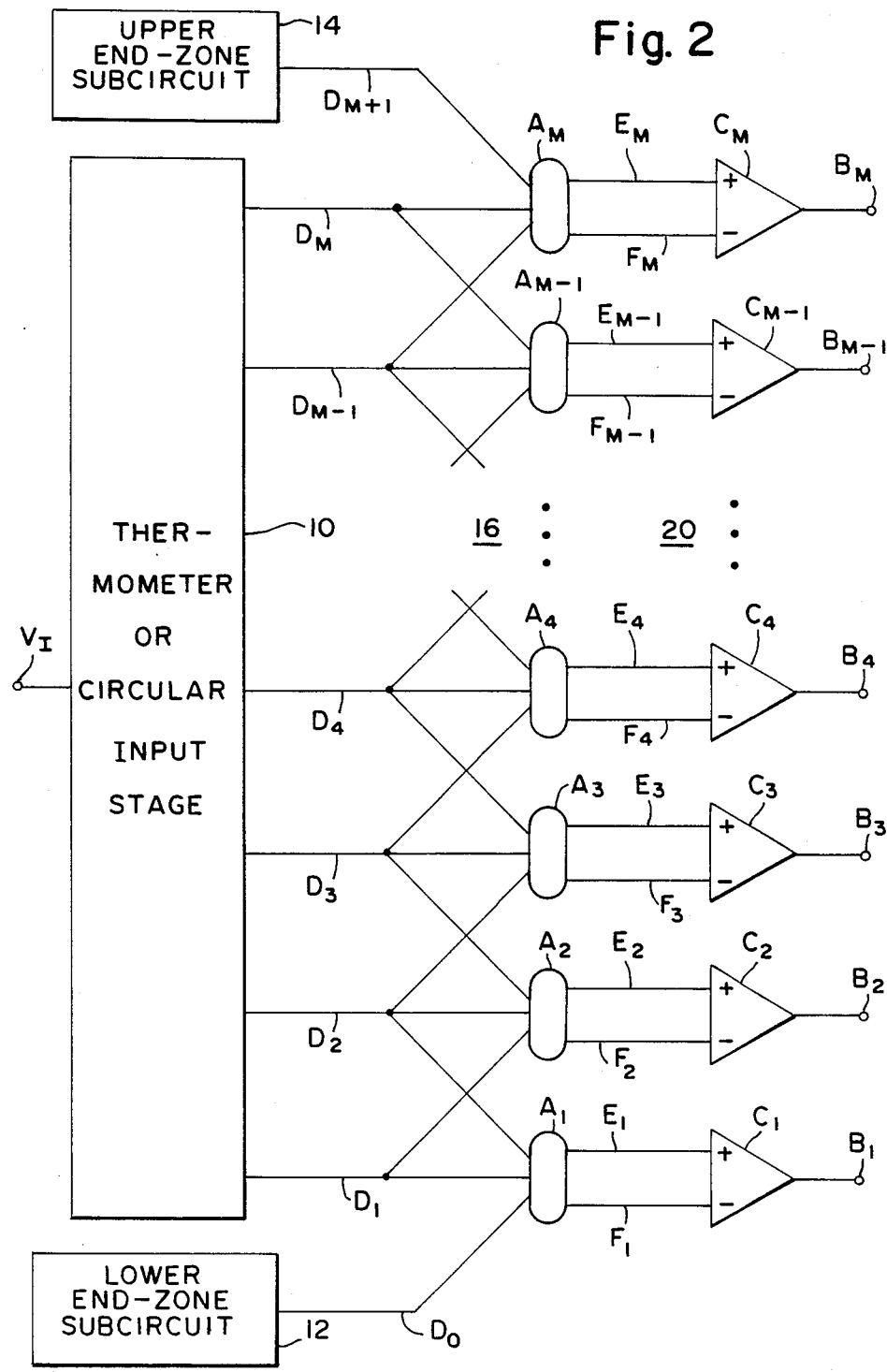
FIG. 2 is a block diagram of an embodiment of FIG. 1 using complementary signals.

FIG. 2 illustrates a double-ended embodiment of the circuit shown in FIG. 1. In the complementary architecture of FIG. 2, each bit $D_i$ is based on the difference between a pair of signals supplied from stage 10 on separate lines. Stage 10 also supplies the complement $D_{Ni}$ of bit $D_i$ since complement $D_{Ni}$ is based on the foregoing difference taken in the opposite direction. $D_{Ni}$ equals $1-D_i$ when $D_i$ and $D_{Ni}$ are represented numerically as 0 and 1.

Signal generator 18 of FIG. 1 is formed as an integral part of summing circuitry 16 in FIG. 2. In receiving the $2K+1$ bits $D_{i-K} \ldots D_i \ldots D_{i+K}$, summing element $A_i$ also receives their respective complements $D_{Ni-K} \ldots D_{Ni} \ldots D_{Ni+K}$. Element $A_i$ then produces signal $F_i$ so as to vary according to a weighted analog summation of the complements. That is, $F_i$ is a function of $$\sum_{j=-K}^{K} b_{ij} D_{Ni+j},$$

where the $b_{ij}$ terms are the weighting constants.

Akin to the $E_i$ signals, each signal $F_i$ normally varies with $$\sum_{j=-K}^{K} b_{ij} D_{Ni+j}$$

in a largely stepwise linear manner. Consequently:

$$F_i \approx A_{Fi} + B \sum_{j=-K}^{K} b_{ij} D_{Ni+j} \quad (4)$$

where $A_{Fi}$ is another constant for element $A_i$. Each $F_i$ summation is preferably done with the same respective constants as the corresponding $E_i$ summation. For the case in which elements $A_1-A_M$ are identical, Eq. (4) can then be simplified to:

$$F_i \approx A + B \sum_{j=-K}^{K} a_j D_{Ni+j} \quad (5)$$

In the preferred embodiment in which the $a_j$ weighting constants are equal, Eq. (5) becomes:

$$F_i \approx A + B \sum_{j=-K}^{K} D_{Ni+j} \quad (6)$$

where the $a_j$ terms have again been set at 1.

Figure 3:
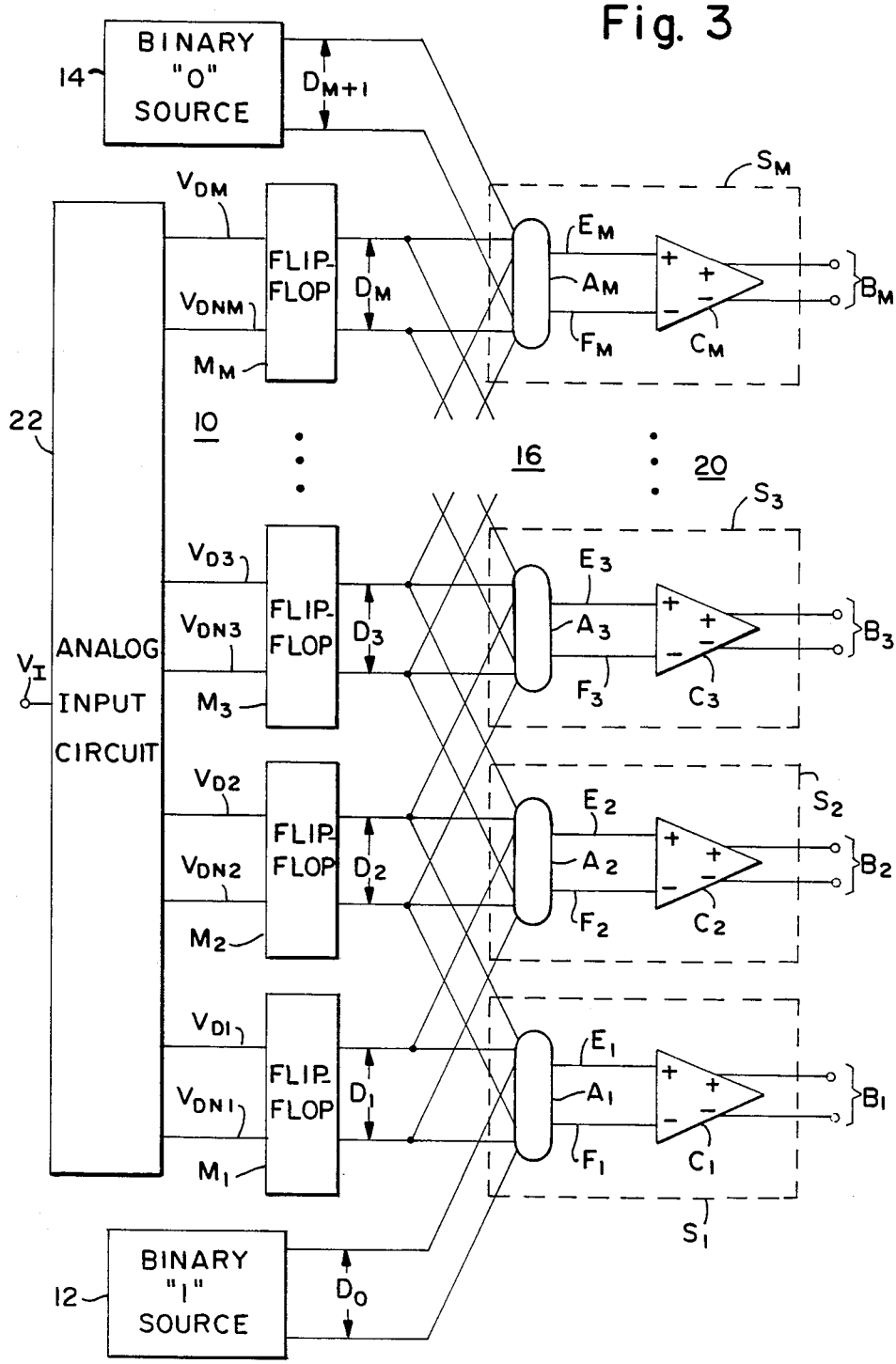
FIGS. 3 and 4 are block diagrams of embodiments of FIG. 2 for correcting thermometer and circular codes, respectively.

Turning to FIG. 3, it depicts additional details for an embodiment of FIG. 2 specifically directed towards a thermometer code. Stage 10 in FIG. 3 consists of an analog input circuit 22 and M flip-flops $M_1, M_2 \ldots M_M$ controlled by a common clock signal (not shown). In response to input $V_I$, circuit 22 supplies M voltages $V_{D1}, V_{D2} \ldots V_{DM}$ and M further voltages $V_{DN1}, V_{DN2} \ldots V_{DNM}$. Each further voltage $V_{DNi}$ is complementary to voltage $V_{Di}$. In response to the clock signal, each flip-flop $M_1$ latches bit $D_i$ at "1" if $V_{Di}$ is greater than $V_{DNi}$ and at "0" if the opposite exists. Each pair of components $A_i$ and $C_i$ forms an extended-input "flip-flop" $S_i$. In turn, interconnected flip-flops $S_1-S_M$ in combination with flip-flops $M_1-M_M$ form a master-slave flip-flop ladder.

In the thermometer-code example shown in FIG. 3, each lower end-zone bit $D_i$ ($i<1$) must be set at "1" to properly terminate the corrected code. Each upper end-zone bit $D_i$ ($i>M$) must similarly be set at "0". These two conditions are shown in Table III below for the case in which K equals 1.

TABLE III

Thermometer Code with End-zone Extension for K = 1

| P | $D_0$ | $D_1$ | $D_2$ | $D_3$ | $D_4$ | $D_{M-1}$ | $D_M$ | $D_{M+1}$ |
|---|---|---|---|---|---|---|---|---|
| <0 | 1 | 0 | 0 | 0 | 0 | 0 | 0 | 0 |
| 0 | 1 | 0 | 0 | 0 | 0 | 0 | 0 | 0 |
| 1 | 1 | 1 | 0 | 0 | 0 | 0 | 0 | 0 |
| 2 | 1 | 1 | 1 | 0 | 0 | 0 | 0 | 0 |
| 3 | 1 | 1 | 1 | 1 | 0 | 0 | 0 | 0 |
| 4 | 1 | 1 | 1 | 1 | 1 | 0 | 0 | 0 |
| . | | | | | | | | |
| M−1 | 1 | 1 | 1 | 1 | 1 | 1 | 0 | 0 |
| M | 1 | 1 | 1 | 1 | 1 | 1 | 1 | 0 |
| >M | 1 | 1 | 1 | 1 | 1 | 1 | 1 | 0 |

FIG. 3 indicates that subcirciuits 12 and 14 consists of binary "1" and "0" sources for providing the requiriste termination.

A simple numerical example based on FIG. 3 and Table III is useful in demonstrating the operational principles of the present correction circuit. Assume that elements $A_1-A_M$ follow Eqs. 3 and 6 with A equal to 0. Let B equal 1 (volt). Each voltage $E_i$ or $F_i$ then varies between 0 (volt) and 3 (volts). Let binary values b1 and b2 for bits $B_1-B_M$ respectively be "1" and "0". Also, assume that bits $D_1-D_M$ form a 6-bit code.

The way in which the circuit operates can now be seen by examining the following three cases:

| | Case 1 | Case 2 | Case 3 |
|---|---|---|---|
| $D_1D_2D_3D_4D_5D_6$ = | 110000 | 110100 | 110010 |
| $D_0D_1D_2D_3D_4D_5D_6D_7$ = | 11100000 | 11101000 | 11100100 |
| $E_1E_2E_3E_4E_5E_6$ = | 321000 | 322110 | 321111 |
| $F_1F_2F_3F_4F_5F_6$ = | 012333 | 011223 | 012222 |
| $B_1B_2B_3B_4B_5B_6$ = | 110000 | 111000 | 110000 |

Case 1 represents the situation in which the original code ($D_1 \ldots D_6$) is error-free. An intended "0"-to-"1" transition occurs between bits $D_2$ and $D_3$. Intermediate voltages $E_2, F_2, E_3$, and $F_3$ are "adjacent" to the "0"-to-"1" transition. Summing circuitry 16 produces these voltages at values between the extreme (0-volt and 3-volt) levels. Nonetheless, $E_2$ is greater than $F_2$, while $E_3$ is less than $F_3$. The corrected code ($B_1 \ldots B_6$) thereby repeats the original code.

Case 2 starts with the above-mentioned example in which a single transition bit error occurs near the intended "0"-to-"1" transition point. The organization of the "1s" and "0s" in the original code indicates either that $D_3$ is wrong or that $D_4$ is wrong. It is not clear whether ($D_1 \ldots D_6$) should have been (110000) or (111100). Consequently, the correction circuitry provides ($B_1 \ldots B_6$) as the "average" of the two potentially correct original codes. This gives both a 1-bit average error and a 1-bit mean-square error.

Case 3 represents the situation in which a single transition bit error occurs far from the regulate "0"-to-"1" transition point. From the way in which the "1s" and "0s" are organized in the original code, it is clear that ($D_1 \ldots D_6$) should have been (110000). The analog summation overcomes the evident error at $D_5$. The corrected code ($B_1 \ldots B_6$) is supplied at the originally intended (110000).

Figure 4:
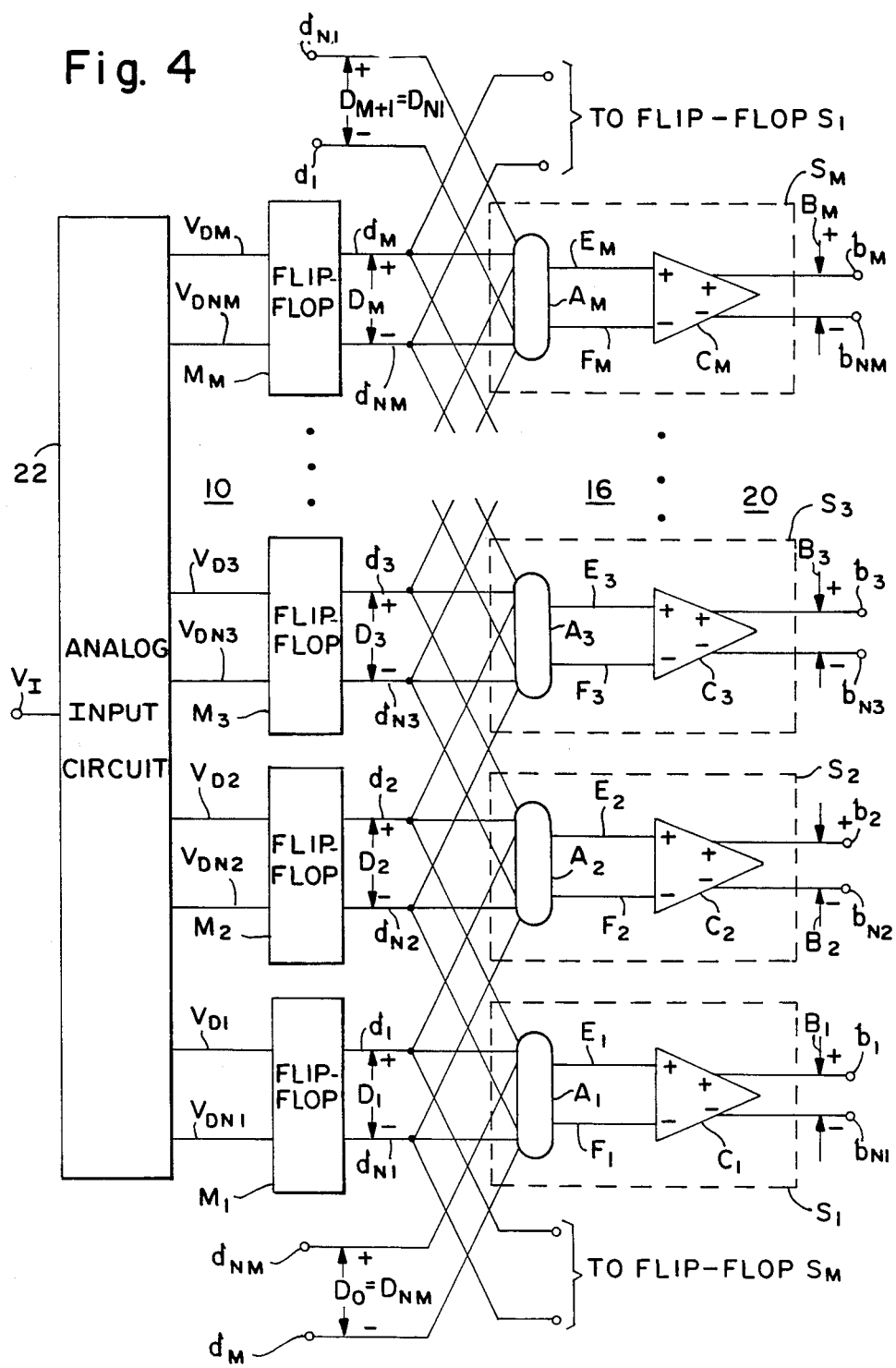

FIG. 4 shows details for an embodiment of FIG. 2 directed particularly towards a circular code. Components 10 16, and 20 in FIG. 4 are further organized in the way described above for FIG. 3. Flip-flops $S_1$-$S_M$ are substantially identical. Voltages $V_{D1}$-$V_{DM}$ and $V_{DN1}$ and $V_{DNM}$ in FIG. 4 preferably are the interpolated signals provided from the interpolation circuit of the folding ADC described in U.S. patent application, Ser. No. 127,867, filed Dec. 2, 1987.

Each lower end-zone bit $D_i$ ($i<1$) in FIG. 4 must be the same as bit $D_{NM+i}$ to enable the corrected circular code to wrap around the ends. Each upper end-zone bit $D_i$ ($i>M$) similarly must be the same as bit $D_{Ni-M}$. Table IV below shows these conditions for the case in which K is 1. Subcircuits 12 and 14 of FIG. 1 are implemented in FIG. 4 by simply making the appropriate connections to flip-flops $M_1$-$M_M$.

FIG. 4 indicates that each original bit $D_i$ ($1 \leq i \leq M$) is a differential signal formed with separate signals $d_i$ and $d_{Ni}$. In particular, $D_i$ equals $d_i$-$d_{Ni}$. Each corrected bit $R_i$ is likewise formed with a pair of signals $b_i$ and $b_{Ni}$. $B_i$ equals $b_i$-$b_{Ni}$.

Figure 5:
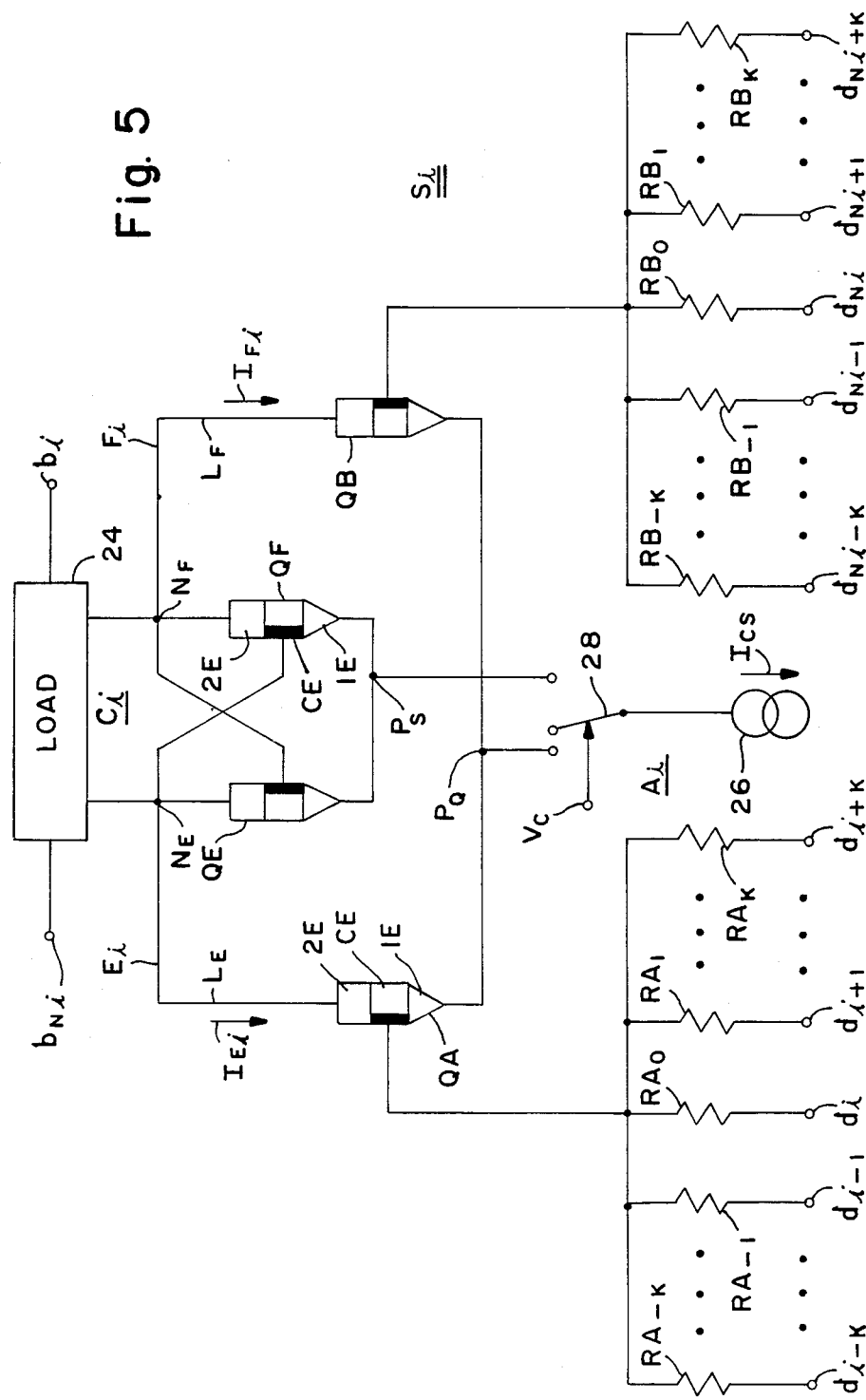
FIGS. 5 and 7 are circuit diagrams of general extended-input flip-flops usable in the circuit of FIG. 3 or 4.

Moving to FIG. 5, it illustrates the internal circuitry of a general voltage-summing circuit for implementing each extended-input flip-flop $S_i$ in FIG. 3 or 4. The flip-flop in FIG. 5 contains several generalized transistors denoted by reference symbols that being with the letter "Q".

TABLE IV

Circular Code with End-zone Extension for K = 1

| P | $D_0$ | $D_1$ | $D_2$ | $D_3$ | $D_4$ | ... | $D_{M-1}$ | $D_M$ | $D_{M+1}$ |
|---|---|---|---|---|---|---|---|---|---|
| 0 | 1 | 0 | 0 | 0 | 0 | | 0 | 0 | 1 |
| 1 | 1 | 1 | 0 | 0 | 0 | | 0 | 0 | 0 |
| 2 | 1 | 1 | 1 | 0 | 0 | | 0 | 0 | 0 |
| 3 | 1 | 1 | 1 | 1 | 0 | | 0 | 0 | 0 |
| 4 | 1 | 1 | 1 | 1 | 1 | | 0 | 0 | 0 |
| . | | | | | | | | | |
| . | | | | | | | | | |
| M−1 | 1 | 1 | 1 | 1 | 1 | | 1 | 0 | 0 |
| M | 0 | 1 | 1 | 1 | 1 | | 1 | 1 | 0 |
| M+1 | 0 | 0 | 1 | 1 | 1 | | 1 | 1 | 1 |
| M+2 | 0 | 0 | 0 | 1 | 1 | | 1 | 1 | 1 |
| M+3 | 0 | 0 | 0 | 0 | 1 | | 1 | 1 | 1 |
| M+4 | 0 | 0 | 0 | 0 | 0 | | 1 | 1 | 1 |
| . | | | | | | | | | |
| 2M−1 | 0 | 0 | 0 | 0 | 0 | | 0 | 1 | 1 |
| 2M | 1 | 0 | 0 | 0 | 0 | | 0 | 0 | 1 |

Each of these transistors has a first flow electrode (1E), a second flow electrode (2E), and a control electrode (CE) for controlling current transmission between the flow electrodes. Charge carriers (electrons or holes) that move between the flow electrodes of each transistor originate at its first electrode and terminate at its second electrode.

Each of the generalized transistors in FIG. 5 is preferably a bipolar transistor having an emitter, a collector, and a base that respectively are the first flow electrode, the second flow electrode, and the control electrode. Each generalized transistor may, however, be embodied as a field-effect transistor (FET) of the insulated-gate or junction type. The FET source, drain, and gate electrode respectively are the first, second, and control electrodes.

Summing element $A_i$ in flip-flop $S_i$ of FIG. 5 centers around like-polarity input transistors QA and QB, 2K+1 resistors $RA_{-K} \ldots RA_0 \ldots RA_K$, and 2K+1 resistors $RB_{-K} \ldots RB_0 \ldots RB_K$. The first electrodes of transistors QA and QB are connected together at a supply point PQ. Their second electrodes are respectively connected by way of lines $L_E$ and $L_F$ to nodes $N_E$ and $N_F$. One end of each resistor $RA_j$ is connected to the QA control electrode. One end of each resistor $RB_j$ is similarly connected to the QB control electrode. The other ends of each pair of corresponding resistors $RA_j$ and $RB_j$ differentially receive bit $D_{i+j}$ in the form of respective signals $d_{i+j}$ and $d_{Ni+j}$.

Comparator $C_i$ in FIG. 5 basically consists of like-polarity storage transistors QE and QF and a load 24 arranged as a conventional bit storage cell. Cell current for enabling the cell to store a binary bit is provided at a supply point $P_S$ connected to the first electrodes of transistors QE and QF. Signal $E_i$ is provided to node $N_E$ at the junction of the QE second electrode and the QF control electrode. Signal $F_i$ is similarly provided to node $N_F$ at the junction of the QF second electrode and the QE control electrode. Load 24 supplies bit $B_i$ in the form of signals $b_i$ and $b_{Ni}$. In certain embodiments, bit $B_i$ is provided directly from nodes $N_F$ and $N_E$ connected to load 24.

The remaining elements are a current source 26 and a switch 28. Current source 26 provides a supply current $I_{CS}$. Switch 28 switches current $I_{CS}$ between points $P_Q$ and $P_S$ in response to a clock signal $V_C$.

The flip-flop operates in the following way. Switch 28 is at the position indicated in FIG. 5 when clock $V_C$ is at a first clocking value $V_{C1}$. Transistors QE and QF are both off. Transistors QA and QB receive current $I_{CS}$ by way of switch 28. The sum of currents $I_{Ei}$ and $I_{Fi}$ flowing respectively through lines $L_E$ and $L_F$ is approximately equal to $I_{CS}$.

Incremental voltages representing the values of bits $D_{i-K}$-$D_{i+K}$ are appropriately summed at the control electrodes of transistors QA and QB. This causes their conductivity levels to differ according to the bit values. $I_{CS}$ divides between $I_{Ei}$ and $I_{Fi}$ in the same way.

Load 24 converts currents $I_{Ei}$ and $I_{Fi}$ into voltages $E_i$ and $F_i$. Switch 28 changes position when clock $V_C$ is switched to a second clocking signal $V_{C2}$ different from $V_{C1}$. Transistors QA and QB both turn off. Transistors QE and QF latch at a "1" or "0" state depending on which of voltages $E_i$ and $F_i$ was higher when signal $V_C$ switched. Bit $B_i$ is provided at a value corresponding to the latched state.

Figure 6:
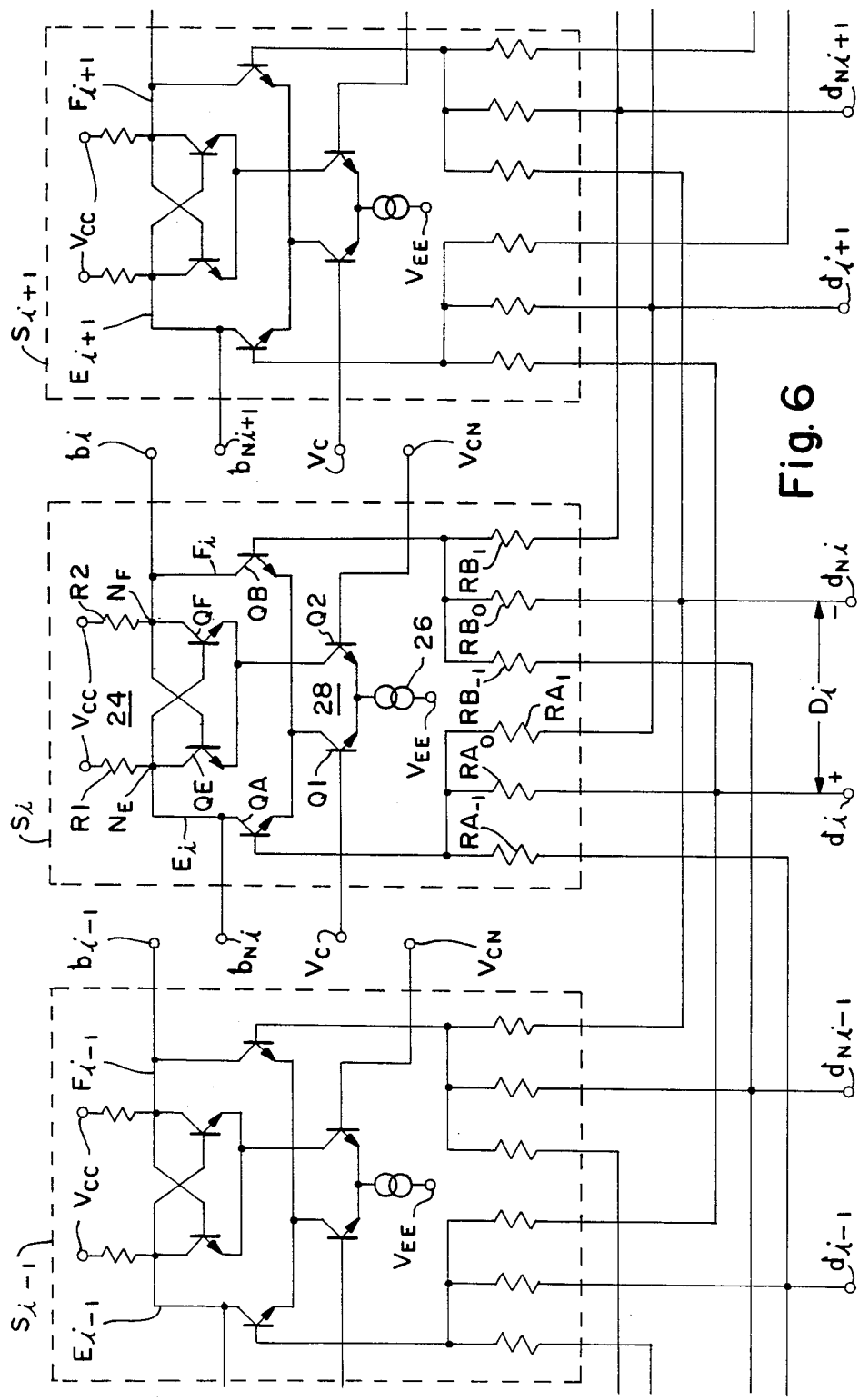
FIGS. 6 and 8 are circuit diagrams showing bipolar implementations of the flip-flops in FIGS. 5 and 7, respectively.

FIG. 6 shows the specific interconnections for a block of three flip-flop $S_{i-1}$, $S_i$, and $S_{i-1}$ employable in FIG. 4 for the case in which K equals 1. Each flip-flop in FIG. 6 is an NPN bipolar embodiment of the flip-flop in FIG. 5. The particular elements in FIG. 6 that implement the items in FIG. 5 can be determined by inspection of the two figures.

Figure 7:
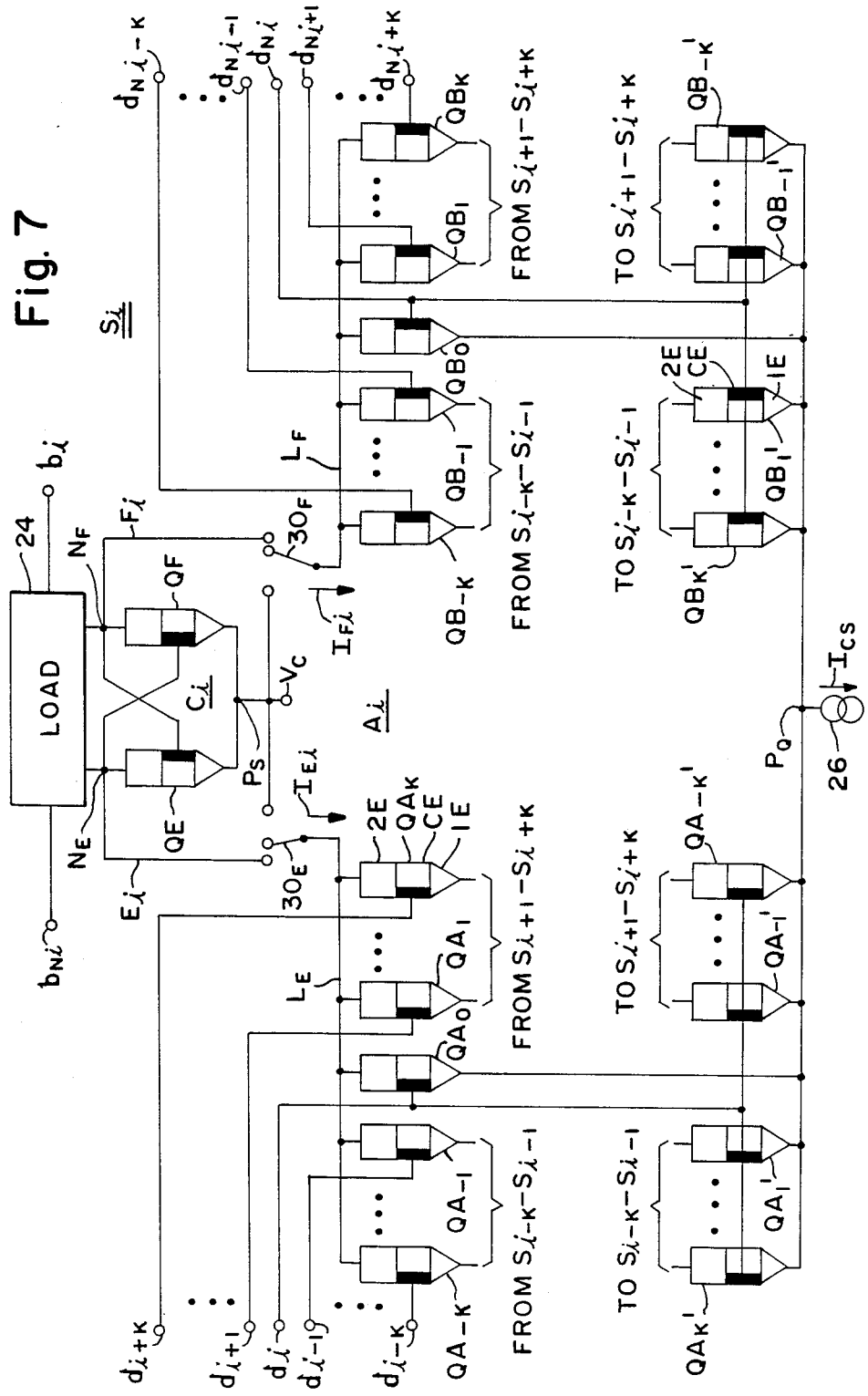

Turning to FIG. 7, it shows details for a current-summing circuit preferably used to implement flip-flop $S_i$ in FIG. 4. Some of the elements in FIG. 7 are the same as in FIG. 5. Only a brief discussion is given here about the common elements.

The summation circuitry in flip-flop $S_i$ of FIG. 7 centers around $2(2K+1)$ like-polarity input transistors denoted as first transistors $QA_{-K} \ldots QA_0 \ldots QA_K$ and second transistors $QB_{-K} \ldots QB_0 \ldots QB_K$. The second electrodes of transistors $QA_K$-$QA_K$ are connected by line $L_E$ to a switch $30_E$ that switches between node $N_E$ and point $P_S$. The second electrodes of transistors $QB_{-K}$-$QB_K$ are similarly connected by way of line $L_F$ to a switch $30_F$ that switches between node $N_F$ and point $P_S$. The control electrodes of each pair of corresponding transistors $QA_j$ and $QB_j$ differentially receive bit $D_{i+j}$ in the form of signals $d_{i+j}$ and $d_{Ni+j}$.

An important feature of the flip-flop in FIG. 7 is that the first electrodes of all but two of the input transistors are connected to the 2K nearest flip-flops. In particular, the first electrodes of each pair $QA_j$ and $QB_j$ in flip-flop $S_i$ are connected to supply point $P_Q$ in (a) flip-flop $S_{i+j+M}$ for $i+j<1$, (b) flip-flop $S_{i+j}$ for $1 \leq i+j \leq M$, and (c) flip-flop $S_{i+j-M}$ for $i+j>M$. Conditions (a) and (c) allow the summation to wrap around the ends for the circular code. FIG. 7 illustrates the situation in which flip-flop $S_i$ is near the center of flip-flops $S_1$-$S_M$. Only transistors $QA_0$ and $QB_0$ in flip-flop $S_i$ have their first electrodes connected to point $P_Q$ in flip-flop $S_i$.

Point $P_Q$ in flip-flop $S_i$ is also connected to the first electrodes of 2K pairs of differentially configured input transistors in the nearest 2K flip-flops. Although not strictly a part of flip-flop $S_i$, these transistors are shown in FIG. 7 using a primed notation. In total, current source 26 in flip-flop $S_i$ provides current $I_{CS}$ through point $P_Q$ to $2(K+1)$ input transistors in summing circuitry 16.

The correction circuit operates as follows using the implementation shown in FIG. 7. Switches $30_E$ and $30_F$ connect lines $L_E$ and $L_F$ respectively to nodes $N_E$ and $N_F$ when clock signal $V_C$ equals $V_{C1}$. Clock $V_C$ is commonly supplied to all of flip-flops $S_1$-$S_M$. Transistors QE and QF in each of flip-flops $S_1$-$S_M$ are therefore turned off.

Because flip-flops $S_1$-$S_M$ are substantially identical, the input transistors in flip-flop $S_i$ receive a total supply current largely equal to $I_{CS}$. Furthermore, each pair of transistors $QA_j$ and $QB_j$ receives a fractional supply current determined by their size. Depending on the value of each bit $D_{i+j}$, one of the transistors in corresponding pair $QA_j$ and $QB_j$ is turned on while the other is turned off. The incremental currents flowing through those of transistors $QA_{-K}$-$QA_K$ that are turned on are summed along line $L_E$ to produce current $I_{Ei}$. Likewise, current $I_{Fi}$ through line $L_F$ is formed as the sum of the incremental currents flowing through those of transistors $QB_{-K}$-$QB_K$ that are turned on. Currents $I_{Ei}$ and $I_{Fi}$ thus vary according to the values of bits $D_{i-K}$-$D_{i+K}$.

Transistors $QA_{-K}$-$QA_K$ and $QB_{-K}$-$QB_K$ are preferably identical except possibly for their widths. Assuming that the first electrodes of each pair $QA_j$ and $QB_j$ have the same width $w_j$, currents $I_{Ei}$ and $I_{Fi}$ can be expressed as:

$$I_{Ei} \approx (I_{CS}/w_T) \sum_{j=-K}^{K} w_j D_{i+j} \quad (7)$$

$$I_{Fi} \approx (I_{CS}/w_T) \sum_{j=-K}^{K} w_j (1 - D_{i+j}) \quad (8)$$

where the term $w_T$ equals $$\sum_{j=-K}^{K} w_j,$$

$D_{i+j}$ is given as 1 when transistor $QA_j$ is on and transistor $QB_j$ is off, and $D_{i+j}$ is given as 0 in the opposite case. Eqs. (7) and (8) are particularized versions of Eqs. (2) and (5) in which the $w_j$ terms are the weighting constants.

As in FIG. 5, load 24 converts currents $I_{Ei}$ and $I_{Fi}$ into voltages $E_i$ and $F_i$. Switches $30_E$ and $30_F$ connect lines $L_E$ and $L_F$ to point $P_S$ when clock $V_C$ is switched to $V_{C2}$. Point $P_S$ receives a supply current largely equal to $I_{CS}$. Transistors QE and QF then latch at a "1" or "0" state. This allows load 24 to produce bit $B_i$ at a binary value dependent on whether signal $E_i$ was greater than or less than signal $F_i$ just before signal $V_C$ changed to $V_{C2}$.

With slight modifications, the circuit shown in FIG. 7 can also be used for a thermometer code. Suitably sized current sources that act as "1" and "0" sources are substituted for the connections that provide the wrap-around.

Figure 8:
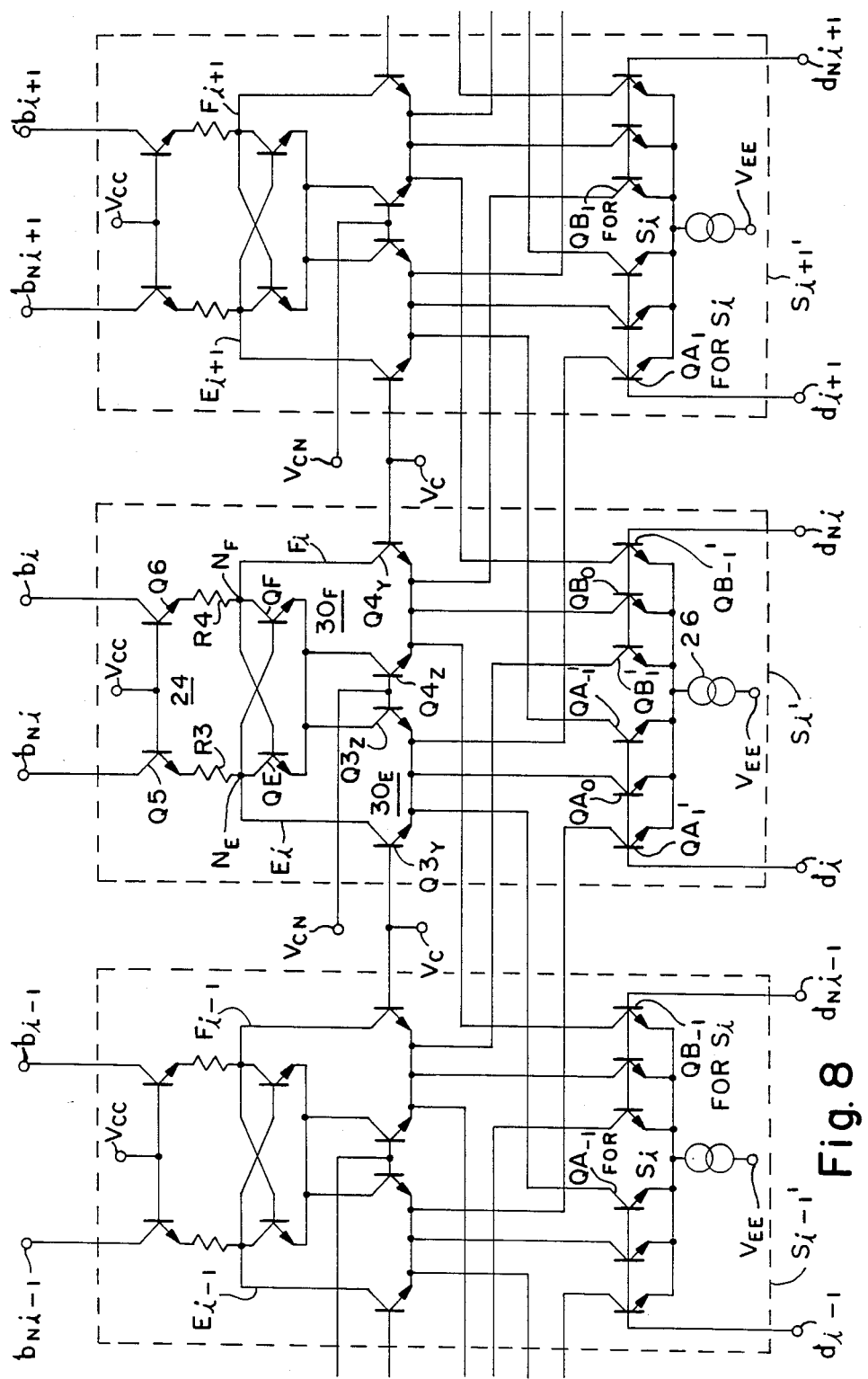

FIG. 8 depicts the specific interconnections for a block of three identical circuits $S_{i-1}'$, $S_i'$, and $S_{i+1}'$ employable in FIG. 4 for the case where K is 1. Circuit $S_i'$ in FIG. 8 is an NPN bipolar implementation of flip-flop $S_i$ in FIG. 7 except that some of the input transistors for flip-flop $S_i$ are shown within circuits $S_{i-1}'$ and $S_{i+1}'$ in FIG. 8. With this in mind, the elements in FIG. 8 that implement the items in FIG. 7 can be ascertained by inspection. Note that signals $b_i$ and $b_{Ni}$ are provided as current outputs in FIG. 8.

While the invention has been described with reference to particular embodiments, this is solely for the purpose of illustration and is not to be construed as limiting the scope of the invention claimed below. For example, the extended-input flip-flops might be implemented with current multipliers using complementary FET's. Thus, various modifications and applications may be made by those skilled in the art without departing from the true scope and spirit of the invention as defined in the appended claims.

We claim:

1. An electronic circuit comprising an input stage for supplying M original binary bits represented sequentially as bits $D_1, D_2 \ldots D_M$ where M is at least 3, the original bits switching between a first binary value and a second binary value as a function of an integer variable P such that, when P is set at any particular integer value in a range extending from 0 to M, each bit $D_i$ (where "i" is a running integer) is ideally at one of the binary values for $i > P$ and at the other binary value for $i \leq P$, characterized by error correction means comprising:

end-zone means for supplying 2K end-zone binary bits represented sequentially as bits $D_{-K+1} \ldots D_0$ and $D_{M+1} \ldots D_{M+K}$ where K is at least 1;

summing means for generating M intermediate signals represented sequentially as signals $E_1, E_2 \ldots$ $E_M$, each signal $E_i$ being generated so as to vary substantially according to a weighted analog summation of the $2K+1$ bits $D_{i-K} \ldots D_i \ldots D_{i+K}$; and comparing means for producing M corrected binary bits represented sequentially as bits $B_1, B_2 \ldots B_M$ by comparing signals $E_1, E_2 \ldots E_M$ respectively with M further signals represented sequentially as signals $F_1, F_2 \ldots F_M$, each bit $B_i$ being produced at one of the binary values if signal $E_i$ is greater than signal $F_i$ and at the other binary value if signal $E_i$ is less than signal $F_i$.

2. A circuit as in claim 1 wherein each original bit $D_i$ is ideally at the first binary value for $i \leq P$ and at the second binary balue for $i > P$, characterized in that each end-zone bit $D_i$ is fixed at the first binary value for $i < 1$ and at the second binary value for $i > M$.

3. A circuit as in claim 1 characterized in that each signal $F_i$ is set at a reference voltage between the extreme voltages achieved by signal $E_i$ during normal operation.

4. A circuit as in claim 1 characterized in that the bits in each grou of $2K+1$ bits $D_{i-K} \ldots D_i \ldots D_{i+K}$ are given approximatley equal weights in generating signal $E_i$.

5. A circuit as in claim 1 characterized in that the summing means generates each signal $F_i$ so as to vary substantially according to a weighted analog summation of the complements of the $2K+1$ bits $D_{i-K} \ldots D_i \ldots D_{i+K}$.

6. A circuit as in claim 5 wherein each original bit $D_i$ is ideally at the first binary value for $1 \leq P$ and at the second binary value for $i > P$, characterized in that each end-zone bit $D_i$ is fixed at the first binary value for $i < 1$ and at the second binary value for $i > M$.

7. A circuit as in claim 5 characterized in that each end-zone bit $D_i$ for $i < 1$ is the same as the complement of bit $d_{m+i}$, and each end-zone bit $D_i$ for $i > M$ is the same as the complement of bit $d_{i-m}$.

8. A circuit as in claim 5 characterized in that the bits in each group of $2K+1$ bits $D_{i-K} \ldots D_i \ldots D_{i+K}$ and their complements are given approximately equal weights in generating signals $E_i$ and $F_i$.

9. A circuit as in claim 5 characterized in that the summing and comparing means comprise M sections represented sequentially as sections $S_1, S_2 \ldots S_M$, each section $S_i$ comprising:
a current source for providing a supply current $I_{CS}$;
first and second input transistors, each having a first flow electrode, a second flow electrode, and a control electrode for controlling current transmission between the flow electrodes, the first electrodes coupled together at a first supply point, each of the second electrodes coupled to a different one of a pair of nodes;
$2K+1$ pairs of first and second impedance elements, one end of each first impedance element coupled to the control electrode of the first transistor, one end of each second impedance element coupled to the control electrode of the second transistor, the other ends of each pair of impedance elements differentially receiving a different one of the $2K+1$ bits $D_{i-K} \ldots D_i \ldots D_{i+K}$;
bit storage means for generating bit $R_i$ in response to signals $E_i$ and $F_i$ respectively supplied at the nodes, the storage means having a second supply point for receiving supply current to store bit $B_i$; and
switching means responsive to a clock signal for switching current $I_{CS}$ between the first and second supply points.

10. A circuit as in claim 9 characterized in that each impedance element is a resistor.

11. A circuit as in claim 5 characterized in that the summing and comparing means comprise M largely identical sections represented sequentially as sections $S_1, S_2 \ldots S_M$, each section $S_i$ comprising:
a current source for providing a supply current $I_{CS}$ at a first supply point;
$2(2K+1)$ like-polarity input transistors represented sequentially as first transistors $QA_{-K} \ldots QA_0 \ldots QA_K$ and as second transistors $QB_{-K} \ldots QB_0 \ldots QB_K$, each transistor having a first flow electrode, a second flow electrode, and a control electrode for controlling current transmission between the flow electrodes, the first electrodes being jointly supplied with a current largely equal to current $I_{CS}$, the first electrodes of each pair of corresponding transistors $QA_j$ and $QB_j$ (where "j" is a running integer) coupled together, the control electrodes of each pair of transistors $QA_j$ and $QB_j$ being differentially responsive to bit $D_{i+j}$, the second electrodes of the first transistors coupled together to a first line, the second electrodes of the second transistors coupled together to a second line;
bit storage means for generating bit $B_i$ in response to signals $E_i$ and $F_i$ respectively supplied to the first and second nodes, the storage means having a second supply point for receiving supply current to store bit $B_i$; and
switching means responsive to a clock signal (a) for coupling the first and second lines respectively to the first and second nodes when the clock signal is at a first clocking value and (b) for coupling the first and second lines to the second supply point when the clocking signal is at a second clocking value different from the first clocking value.

12. A circuit as in claim 11 characterized in that the first electrodes of each pair of transistors $QA_j$ and $QB_j$ in each section $S_i$ are further coupled to the first supply point in sections $S_{i+j}$ for $1 \leq i+j \leq M$.

13. A circuit as in claim 12 characterized in that each end-zone bit $D_i$ for $i < 1$ is the complement of bit $d_{M+i}$, and each end-zone bit $D_i$ for $i > M$ is the same as the complement of bit $d_{i-M}$.

14. A circuit as in claim 11 characterized in that the first electrodes of each pair of corresponding transistors $QA_j$ and $QB_j$ in each section $S_i$ are further coupled to the first supply point in (a) section $S_{i+j+M}$ for $i+j < 1$, (b) section $S_{i+j}$ for $1 \leq i+j \leq M$, and (c) section $S_{i+j-M}$ for $i+j > M$.

15. A circuit as in claim 14 characterized in that: the first electrodes of transistors $QA_j$ and $QB_j$ in each section $S_i$ have largely the same width $w_j$; and the currents $I_{Ei}$ and $I_{Fi}$ flowing respectively through the first and second lines in each section $S_i$ when the clock signal is at the first clocking value are given as $$I_{Ei} \approx (I_{CS}/w_T) \sum_{j=-K}^{K} w_j D_{i+j}$$

$$I_{Fi} \approx (I_{CS}/w_T) \sum_{j=-K}^{K} w_j (1 - D_{i+j})$$

where $$w_T = \sum_{j=-K}^{K} w_j,$$

$D_{i+j}$ is given as 1 when transistor $QA_j$ is fully on and transistor $QB_j$ is off, and $D_{i+j}$ is given as 0 when transistor $QB_j$ is fully on and transistor $QA_j$ is off.

16. A circuit as in claim 16 characterizead in that each transistor is a bipolar transistor.

17. A digital averaging circuit comprising M sections represented seqeuentially as sections $S_1, S_2 \ldots S_M$, where M is at least 3, for producing M corresponding binary bits represented sequentially as bits $B_1, B_2 \ldots B_M$ in response to M+2K binary bits represented sequentially as bits $D_{-K+1} \ldots D_0, D_1 \ldots D_M, D_{M+1} \ldots D_{M+K}$, where K is at least 1, each section $S_i$ (where "i" is a running integer) comprising:

a current source for providing a supply current $I_{CS}$;

first and second input transistors, each having a first flow electrode, a second flow electrode, and a control electrode for controlling current transmission between the flow electrodes, the first electrodes coupled together at a first supply point, each of the second electrodes coupled to a different one of a pair of nodes that respectively provide signals $E_i$ and $F_i$, 2K+1 pairs of first and second impedance elements, one end of each first impedance element coupled to the control electrode of the first transistor, one end of each second impedance element coupled to the control electrode of the second transistor, the other ends of each pair of impedance elements differentially receiving a different one of the 2K+1 bits $D_{i-K} \ldots D_i \ldots D_{i+K}$;

bit storage means for generating bit $B_i$ in response to signals $E_i$ and $F_i$ at the nodes, the storage means having a second supply point for receiving supply current to store bit $B_i$; and switching means responsive to a clock signal for coupling the current source (a) to the first supply point when the clock signal is at a first clocking value and (b) to the second supply point when the clock signal is changed to a second clocking value different from the first clocking value to enable the storage means to produce bit $B_i$ at a first binary value or a second binary value depending on whether signal $E_i$ was greater than or less than signal $F_i$ just before the clock signal changed to the second clocking value.

18. A circuit as in claim 17 wherein each impedance element is a resistor.

19. A digital averaging circuit comprising M sections represented sequentially as sections $S_1, S_2 \ldots S_M$, where M is at least 3, for producing M corresponding binary bits represented sequentially as bits $B_1, B_2 \ldots B_M$ in response to M+2K binary bits represented sequentially as bits $D_{-K+1} \ldots D_0, D_1 \ldots D_M, D_{M+1} \ldots D_{M+K}$ where K is at least 1, each section $S_i$ (where "i" is a running integer) comprising:

a current source for providing a supply current at a first supply point;

2(2K+1) like-polarity input transistors represented sequentially as first transistors $QA_{-K} \ldots QA_0 \ldots QA_K$ and as second transistors $QB_{-K} \ldots QB_0 \ldots QB_K$, each transistor having a first flow electrode, a second flow electrode, and a control electrode for controlling current transmission between the flow electrodes, the control electrodes of each pair of corresponding transistors $QA_j$ and $QB_j$ (where "j" is a running integer) being differentially responsive to bit $D_{i+j}$, the first electrodes of each pair of transistors $QA_j$ and $QB_j$ coupled together to the first supply point in section $S_{i+j}$ for $1 \leq i+j \leq M$, the second electrodes of the first transistors coupled together to a first line, the second electrodes of the second transistors coupled together to a second line;

bit storage means for generating bit $B_i$ in response to signals $E_i$ and $F_i$ respectively provided at first and second nodes, the storage means having a second supply point for receiving supply current to store bit $B_i$; and switching means responsive to a clock signal (a) for coupling the first and second lines respectively to the first and second nodes when the clock signal is at a first clocking value and (b) for coupling the first and second lines to the second supply point when the clock signal is changed to a second clocking value different from the first clocking value to enable the storage means to produce bit $B_i$ at a first binary value or a second binary value depending on whether signal $E_i$ was greater than or less than signal $F_i$ just before the clock signal changed to the second clocking value.

20. A circuit as in claim 19 wherein each transistor is a bipolar transistor.

* * * * *